(12) United States Patent
Meynier et al.

(10) Patent No.: US 12,145,838 B2
(45) Date of Patent: Nov. 19, 2024

(54) CMUT TRANSDUCER WITH MOTION-STOPPING STRUCTURE AND CMUT TRANSDUCER FORMING METHOD

(71) Applicant: VERMON SA, Tours (FR)

(72) Inventors: Cyril Meynier, Tours (FR); Dominique Gross, Tours (FR); Nicolas Senegond, Tours (FR)

(73) Assignee: VERMON SA, Tours (FR)

( * ) Notice: Subject to any disclaimer, the term of this patent is extended or adjusted under 35 U.S.C. 154(b) by 395 days.

(21) Appl. No.: 17/637,125

(22) PCT Filed: Jul. 16, 2020

(86) PCT No.: PCT/IB2020/000624
§ 371 (c)(1),
(2) Date: Feb. 22, 2022

(87) PCT Pub. No.: WO2021/038288
PCT Pub. Date: Mar. 4, 2021

(65) Prior Publication Data
US 2022/0340410 A1 Oct. 27, 2022

Related U.S. Application Data

(60) Provisional application No. 62/894,259, filed on Aug. 30, 2019.

(51) Int. Cl.
*B81B 3/00* (2006.01)
*B06B 1/02* (2006.01)
(Continued)

(52) U.S. Cl.
CPC .......... *B81B 3/0021* (2013.01); *B06B 1/0292* (2013.01); *B81C 1/00158* (2013.01);
(Continued)

(58) Field of Classification Search
None
See application file for complete search history.

(56) References Cited

U.S. PATENT DOCUMENTS 9,061,318 B2 * 6/2015 Rothberg ............ B81C 1/00158
2005/0228285 A1 10/2005 Huang et al.
(Continued)

FOREIGN PATENT DOCUMENTS

WO 02/43089 A2 5/2002
WO 2006/134580 A2 12/2006
(Continued)

OTHER PUBLICATIONS

European Patent Office, International Search Report issued in corresponding Application No. PCT/IB2020/000624, mailed Dec. 9, 2020.
(Continued)

*Primary Examiner* — Michelle Mandala
(74) *Attorney, Agent, or Firm* — Stites & Harbison, PLLC; Jeffrey A. Haeberlin (57) ABSTRACT

The present disclosure relates to a CMUT transducer (200) comprising: —a conductive or semiconductor substrate (201) coated with a stack of one or a plurality of dielectric layers (203, 213); —a cavity (205, 215) formed in said stack; —a conductive or semiconductor membrane (221) suspended above the cavity; —at the bottom of the cavity, a conductive region (209) in contact with the upper surface of the substrate, said conductive region being interrupted on a portion of the upper surface of the substrate; and—in the cavity, a stop structure (207) made of a dielectric material localized on or above the area of interruption of the conductive region (209).

20 Claims, 8 Drawing Sheets (51) Int. Cl.
*B81C 1/00* (2006.01)
*G01N 29/24* (2006.01)

(52) U.S. Cl.
CPC ............... *B81B 2201/0271* (2013.01); *B81B 2203/0127* (2013.01); *B81B 2203/0315* (2013.01); *B81B 2203/04* (2013.01); *B81C 2201/013* (2013.01); *B81C 2201/0178* (2013.01); *G01N 29/2406* (2013.01)

(56) References Cited

U.S. PATENT DOCUMENTS

| | | |
|---|---|---|
| 2006/0004289 A1 | 1/2006 | Tian et al. |
| 2007/0052093 A1 | 3/2007 | Machida et al. |
| 2008/0290756 A1* | 11/2008 | Huang ............... B06B 1/0292 |
| | | 310/300 |
| 2010/0225200 A1 | 9/2010 | Kupnik et al. |
| 2013/0087867 A1 | 4/2013 | Ho et al. |

FOREIGN PATENT DOCUMENTS

| | | |
|---|---|---|
| WO | 2007/015218 A2 | 2/2007 |
| WO | 2009/073562 A1 | 6/2009 |

OTHER PUBLICATIONS

Huang, Y., et al. "Fabricating capacitive micromachined ultrasonic transducers with wafer-bonding technology," Journal of Microelectromechanical Systems., vol. 12, No. 2, Apr. 1, 2003 (Apr. 1, 2003), pp. 128-137, XP055746520.

* cited by examiner

CMUT TRANSDUCER WITH MOTION-STOPPING STRUCTURE AND CMUT TRANSDUCER FORMING METHOD

TECHNICAL BACKGROUND

The present disclosure generally relates to the field of ultrasound transducers and, more particularly, to that of capacitive micromachined ultrasonic transducers, also called CMUT transducers.

PRIOR ART

Conventionally, a CMUT transducer comprises a flexible membrane suspended above a cavity, a first electrode, called lower electrode, located on the side of the cavity opposite to the membrane, and a second electrode, called upper electrode, located on the side of the cavity opposite to the first electrode and rigidly attached to the flexible membrane. When an appropriate excitation voltage is applied between the lower and upper electrodes of the transducer, the flexible membrane starts vibrating under the effect of the electrostatic force applied between the lower and upper electrodes, and emits an ultrasound acoustic wave. Conversely, when the transducer receives an acoustic wave in a given frequency range, the flexible membrane vibrates, which results in the appearing of an alternative voltage between the lower and upper electrodes of the transducer under the effect of the capacitance variation between the electrodes (when a DC bias is applied between the lower and upper electrodes).

A CMUT transducer is conventionally coupled to an electronic control circuit configured to, during a transmission phase, apply an excitation voltage between the transducer electrodes, to cause the transmission of an ultrasound wave by the transducer and, during a reception phase, read the voltage generated between the lower and upper electrodes of the transducer under the effect of the received ultrasound wave.

It would be desirable to have a CMUT transducer structure and a method of manufacturing such a structure, overcoming all or part of the disadvantages of known CMUT transducer structures and manufacturing methods.

SUMMARY

To achieve this, an embodiment provides a CMUT transducer comprising:
- a conductive or semiconductor substrate coated with a stack of one or a plurality of dielectric layers;
- a cavity formed in said stack;
- a conductive or semiconductor membrane suspended above the cavity;
- at the bottom of the cavity, a conductive region in contact with the upper surface of the substrate, said conductive region being interrupted on a portion of the upper surface of the substrate; and
- in the cavity, a stop structure made of a dielectric material localized on or above the area of interruption of the conductive region.

According to an embodiment, the stop structure has a height greater than that of the conductive region, to prevent any contact between the membrane and the conductive region in case of a collapsing of the membrane.

According to an embodiment, the stop structure has a height smaller than that of the cavity to allow a vertical displacement of the membrane towards the bottom of the cavity.

According to an embodiment, the stop structure is affixed to the upper surface of the substrate.

According to an embodiment, the stop structure is affixed to the lower surface of the membrane.

According to an embodiment, the conductive region is in contact, by its rear surface, with the substrate over its entire surface.

According to an embodiment, a dielectric layer coats the upper surface of the substrate at the bottom of the cavity, the conductive region extending on the upper surface of said dielectric layer and in openings crossing said dielectric layer and emerging onto the upper surface of the substrate.

According to an embodiment, the conductive region is made of doped polysilicon.

According to an embodiment, the substrate is made of silicon.

According to an embodiment, the membrane is made of silicon.

Another embodiment provides a method of manufacturing the above defined CMUT transducer, comprising the steps of:
a) forming a first dielectric layer on the upper surface of the substrate;
b) etching the first dielectric layer down the upper surface of the substrate to form a lower portion of the cavity of the transducer, while keeping in a central portion of the cavity a portion of the first dielectric layer forming the stop structure of the transducer;
c) depositing at the bottom of the cavity a conductive layer having a thickness smaller than that of the first dielectric layer, forming the conductive region of the transducer;
d) forming a second dielectric layer on a surface of a semiconductor layer arranged on a temporary support;
e) etching the second dielectric layer down to the surface of the semiconductor layer to form an upper portion of the cavity;
f) assembling the temporary support and the substrate by bonding of the surface of the first dielectric layer opposite to the substrate onto the surface of the second dielectric layer opposite to the semiconductor layer; and
e) removing the temporary support, while keeping above the cavity the semiconductor layer forming the membrane of the transducer.

According to an embodiment, the method comprises the steps of:
a) forming a first dielectric layer on the upper surface of the substrate;
b) etching the first dielectric layer down to the upper surface of the substrate to form a lower portion of the cavity;
c) depositing at the bottom of the cavity a conductive layer having a thickness greater than that of the first dielectric layer, forming the conductive region of the transducer;
d) forming a second dielectric layer on a surface of a semiconductor layer arranged on a temporary support;
e) etching the second dielectric layer down to the surface of the semiconductor layer to form an upper portion of the cavity, while keeping in a central portion of the cavity a portion of the second dielectric layer forming the stop structure of the transducer;
f) assembling the temporary support and the substrate by bonding of the surface of the first dielectric layer opposite to the substrate onto the surface of the second dielectric layer opposite to the semiconductor layer; and e) removing the temporary support, while keeping above the cavity the semiconductor layer forming the membrane of the transducer.

Another embodiment provides a method of manufacturing the above defined CMUT transducer, comprising the steps of:

a) forming the conductive region on top of and in contact with the upper surface of the substrate;
b) forming a dielectric layer on a surface of a semiconductor layer arranged on a temporary support;
c) etching a portion of the thickness of the dielectric layer to form a first cavity;
d) etching the first dielectric layer down to the upper surface of the substrate to form a second cavity, while keeping in a central portion of the second cavity a portion of the first dielectric layer partially etched at step c);
e) assembling the temporary support and the substrate by bonding of the surface of dielectric layer opposite to the semiconductor layer onto the upper surface of the substrate; and
f) removing the temporary support, while keeping above the cavity the semiconductor layer forming the membrane of the transducer.

Another embodiment provides a method of manufacturing the above defined CMUT transducer, comprising the steps of:

a) forming a dielectric layer on the upper surface of the substrate;
b) etching a portion of the thickness of the dielectric layer to form the cavity of the transducer;
c) forming, at the bottom of the cavity, openings crossing the dielectric layer and emerging onto the upper surface of the substrate;
d) depositing the conductive region in the cavity on top of and in contact with the upper surface of the dielectric layer and in the openings;
e) forming the stop structure in the cavity, on top of and in contact with the upper surface of the dielectric layer, so that said structure has a thickness greater than that of the conductive region and smaller than the depth of the cavity;
f) providing a semiconductor layer arranged on a temporary support;
g) assembling the temporary support and the substrate by bonding of the surface of the semiconductor layer opposite to the temporary support onto the surface of the dielectric layer opposite to the substrate; and
h) removing the temporary support, while keeping above the cavity the semiconductor layer forming the membrane of the transducer.

Another embodiment provides a method of manufacturing the above defined CMUT transducer, comprising the steps of:

a) forming a dielectric layer on the upper surface of the substrate;
b) locally etching a portion of the thickness of the dielectric layer to form the cavity of the transducer;
c) forming, at the bottom of the cavity, openings crossing the dielectric layer and emerging onto the upper surface of the substrate;
d) depositing the conductive region in the cavity on top of and in contact with the upper surface of the dielectric layer and in the openings;
e) providing a semiconductor layer arranged on a temporary support;
f) forming the stop structure on the surface of the semiconductor layer opposite to the temporary support, so that said structure has a thickness greater than that of the conductive region and smaller than the depth of the cavity;
g) assembling the temporary support and the substrate by bonding of the surface of the semiconductor layer opposite to the temporary support onto the surface of the dielectric layer opposite to the substrate; and
h) removing the temporary support, while keeping above the cavity the semiconductor layer forming the membrane of the transducer.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various possible applications of the described transducers have not been detailed, the described embodiments being compatible with usual applications of ultrasound transducers, particularly in ultrasound imaging devices. Further, the circuits for controlling the described transducers have not been detailed, the described embodiments being compatible with all or most known CMUT transducer control circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
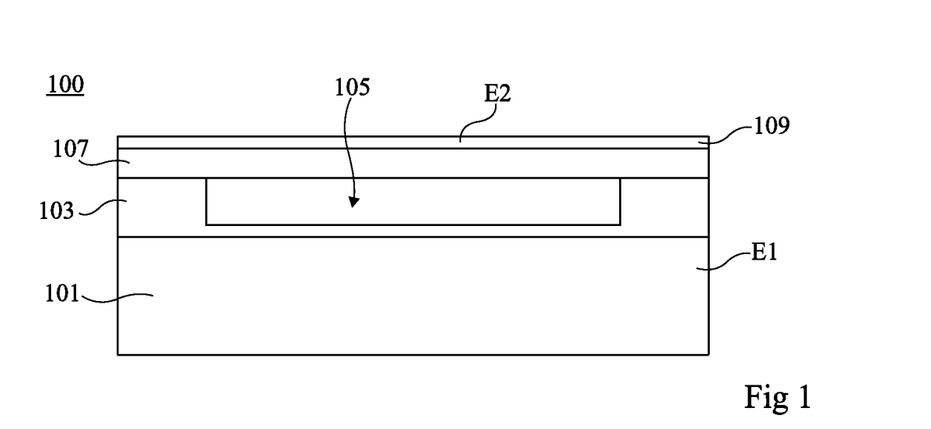
FIG. 1 is a cross-section view schematically showing an example of a CMUT transducer.

FIG. 1 is a cross-section view schematically showing an example of a CMUT transducer 100.

Transducer 100 comprises a doped semiconductor layer 101, for example, made of silicon, defining a lower electrode E1 of the transducer.

Semiconductor layer 101 is coated, on its upper surface side, with a rigid support layer 103 made of a dielectric material, for example, silicon oxide. In the example, layer 103 is in contact, by its lower surface, with the upper surface of semiconductor layer 101.

Transducer 100 further comprises a cavity 105 formed in layer 103. Cavity 105 extends vertically from the upper surface of layer 103, towards its lower surface. In the shown example, cavity 105 is non-through, that is, it does not emerge on the lower surface side of layer 103. In other words, a lower portion of the thickness of layer 103 coats the upper surface of electrode 101 at the bottom of cavity 105.

Transducer 100 further comprises a flexible membrane 107 suspended above cavity 105. In this example, membrane 107 is made of a semiconductor material, for example, of silicon. Membrane 107 extends above cavity 105 and is bonded, at the periphery of cavity 105, by its lower surface, to the upper surface of dielectric layer 103. As an example, the lower surface of membrane 107 is directly in contact with the upper surface of dielectric layer 103 at the periphery of cavity 105.

Transducer 100 further comprises, above membrane 107, a conductive layer 109, for example, a metal layer, defining an upper electrode E2 of the transducer. Conductive layer 109 for example extends over substantially the entire upper surface of membrane 107. In the shown example, conductive layer 109 is in contact, by its lower surface, with the upper surface of membrane 107.

Transducer 100 may be coupled to an electronic control circuit CTRL, not detailed, connected to its lower and upper electrodes E1 and E2, configured to, during a transmission phase, apply an excitation voltage between electrodes E1 and E2 and, during a reception phase, read a voltage between electrodes E1 and E2. As an example, the control circuit may be configured to, during transmission and/or reception phases, apply a DC bias voltage between electrodes E1 and E2. During transmission phases, the control circuit further applies between electrodes E1 and E2 an AC excitation voltage superposed to the DC bias voltage, to cause a vibration of membrane 107 resulting in the transmission of an ultrasound acoustic wave. During reception phases, an AC voltage superposed to the DC bias voltage appears between electrodes E1 and E2 under the effect of the received acoustic wave. The AC voltage is read by the control circuit.

When the voltage applied between electrodes E1 and E2 of the transducer exceeds, in absolute value, a given threshold, called "collapse voltage" or "pull-in voltage", flexible membrane 107 is capable of coming into contact, by its lower surface, with the bottom of cavity 105, in a central region (in top view) of cavity 105. In this position, called collapsed, of the membrane, the portion of dielectric layer 103 located at the bottom of cavity 105 enables to avoid a short-circuit between electrodes E1 and E2 of the transducer (via semiconductor membrane 107).

A limitation of the structure of FIG. 1 is that, in collapsed position of membrane 107, a strong electric field, for example higher than 2 MV/cm, is generated in the portion of dielectric layer 103 in contact with membrane 107 at the bottom of cavity 105. This may cause an injection of electric charges in dielectric layer 103 at the bottom of cavity 105. The charges may induce a modification of the bias voltages required to drive the transducer. In certain conditions, this electric field may result in causing a breakdown of dielectric layer 103 at the bottom of cavity 105.

Another limitation of the structure of FIG. 1 is due to the fact that semiconductor membrane 107 and conductive layer 109 extend not only above cavity 105, but also above the periphery of cavity 105. This results in an unwanted parasitic capacitive coupling between electrodes E1 and E2, at the periphery of cavity 105. This may result in degrading the quality of the measurements performed by means of the transducer.

FIGS. 2A to 2F are cross-section or top views schematically illustrating steps of an example of a method of manufacturing a CMUT transducer 200 according to an embodiment.

Figure 2A:
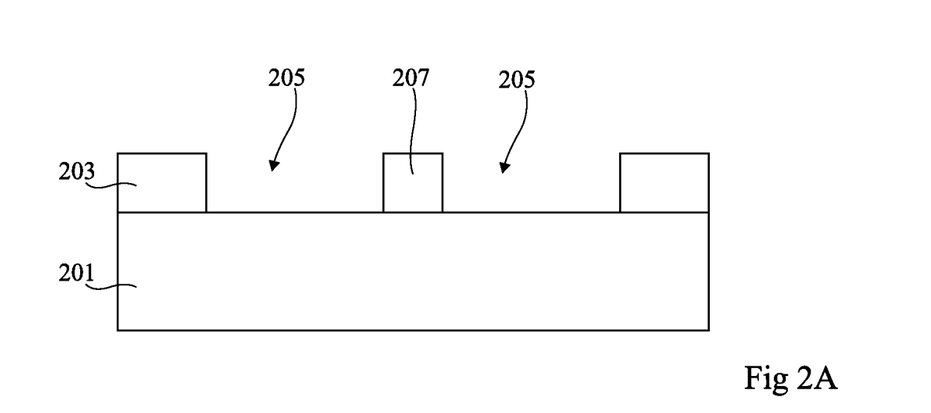
FIGS. 2A, 2B, 2C, 2D, 2E, and 2F are cross-section or top views illustrating steps of an example of a method of manufacturing a CMUT transducer according to an embodiment.

FIG. 2A is a cross-section view illustrating the structure obtained at the end of a step of forming a dielectric layer 203 on the upper surface side of a conductive or semiconductor substrate 201, followed by a step of forming of a cavity 205 on the upper surface side of dielectric layer 203.

Substrate 201 is for example made of silicon.

Substrate 101 is preferably heavily doped, for example, with a doping level in the range from $10^{13}$ to $10^{18}$ atoms/cm$^3$, for example in the order of $10^{16}$ atoms/cm$^3$.

Layer 203 may be formed by oxidation of an upper portion of substrate 201, for example, according to a dry thermal oxidation method. As a variation, layer 203 may be formed by deposition of a dielectric material on the upper surface of substrate 201. Layer 203 is for example made of silicon oxide. The thickness of dielectric layer 203 is for example in the range from 10 nm to 5 µm, for example, in the order of 500 nm.

Cavity 205 may be formed by local etching from the upper surface of dielectric layer 203, for example, by plasma etching. In this example, cavity 205 is through, that is, it extends vertically across the entire thickness of dielectric layer 203 and emerges onto the upper surface of substrate 201. The lateral dimensions of cavity 105 are for example in the range from 5 to 500 µm.

In this example, layer 203 is kept intact in at least a central region 207 of cavity 205. In other words, cavity 205 is interrupted at the level of region 207. In the shown example, region 207 forms a pad located in a central portion of cavity 205. Pad 207 for example has a circular shape in top view. Cavity 205 may have, in top view, the shape of a ring, for example, a circular ring, surrounding pad 207. As an example, in top view, pad 207 and cavity 205 are concentric.

Figure 2B:
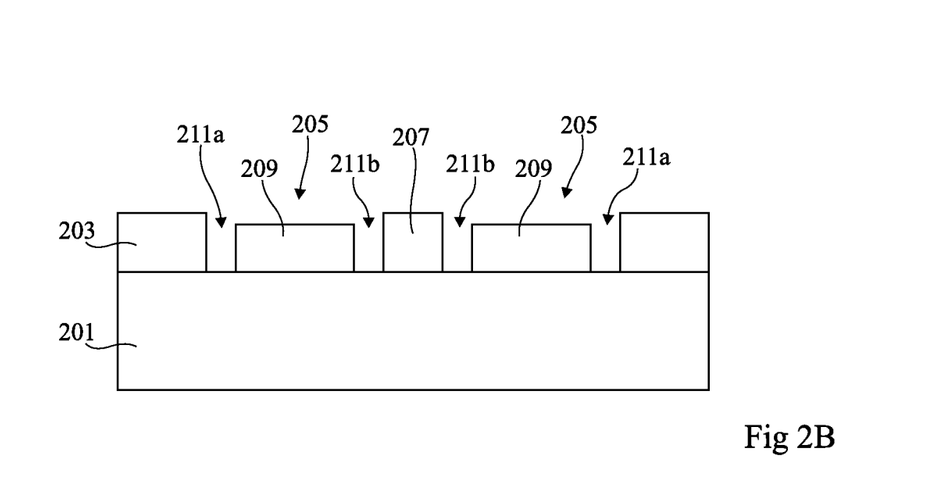
Figure 2C:
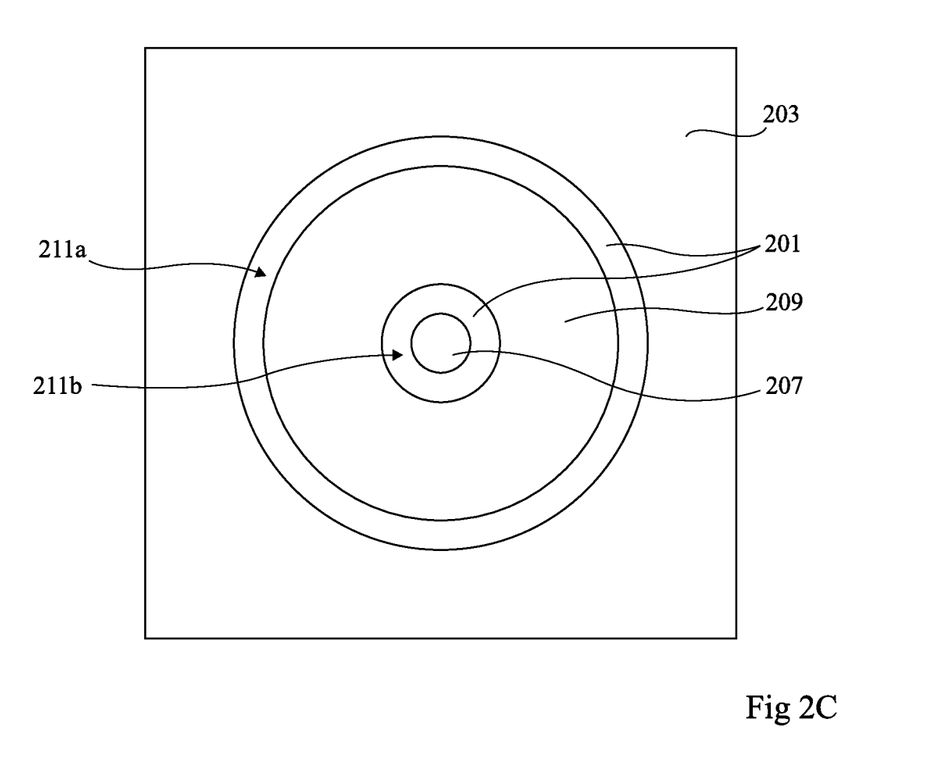

FIG. 2B is a cross-section view illustrating the structure obtained at the end of a subsequent step of forming, at the bottom of cavity 205, a conductive region 209 in contact with the upper surface of substrate 201. FIG. 2C is a top view of the structure of FIG. 2B.

In this example, conductive region 209 extends, in top view, on top of and in contact with the most part of the upper surface of the substrate portion 201 exposed at the bottom of cavity 205. In the shown example, conductive region 209 is however not in contact with the sides of dielectric layer 203.

In other words, in top view, a strip 211a of non-zero width of the substrate portion 201 exposed at the bottom of cavity 205 separates conductive region 209 from the lateral walls of cavity 205, and a strip 211b of non-zero width of the substrate portion 201 exposed at the bottom of cavity 205 separates conductive layer 209 from the sides of dielectric region 207. The width (horizontal dimension in the orientation of FIG. 2B) of guard strips 211a and 211b is for example in the range from 0.5 to 5 μm, for example in the order of 2 μm.

The thickness (vertical dimension in the orientation of FIG. 2B) of conductive region 209 is smaller than the thickness of dielectric layer 203. As an example, the thickness of conductive layer 209 is smaller by from 10 to 200 nm, for example, by approximately 100 nm, than the thickness of dielectric layer 203. The thickness of conductive layer 209 is for example in the range from 10 nm to 4.99 μm, for example, in the order of 400 nm.

To form conductive region 209, a continuous layer of the conductive material of region 209 may first be deposited over the entire upper surface of the structure of FIG. 2A, that is, not only on the bottom of cavity 205, but also on the upper surface of dielectric layer 203 at the periphery of cavity 205, and on the upper surface of dielectric region 207. This layer may then be locally removed, for example, by photolithography and etching, to only keep conductive region 209 at the bottom of cavity 205. An additional chemical-mechanical polishing (CMP) step may then be provided to properly clean the upper surface of dielectric layer 203 at the periphery of the cavity.

Region 209 is for example made of doped polysilicon, or of any other conductive metal or conductive material that can handle the temperatures of the following process steps.

Figure 2D:
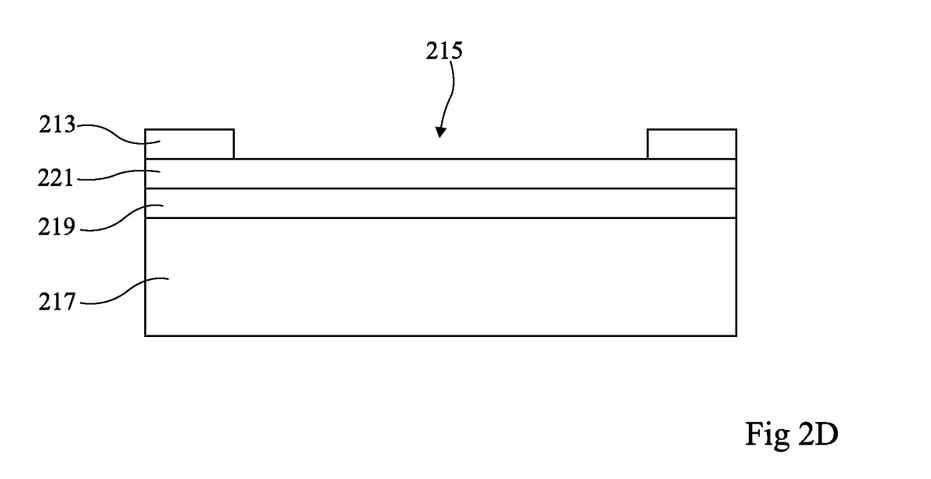

FIG. 2D is a cross-section view illustrating the structure obtained at the end of a step of forming a dielectric layer 213 on the upper surface side of a stack of semiconductor-on-insulator (SOI) type, followed by a step of forming a cavity 215 on the upper surface side of dielectric layer 213.

In the present example, the initial stack comprises a support substrate 217, a dielectric layer 219 arranged on top of and in contact with the upper surface of substrate 217, and a semiconductor layer 221 arranged on top of and in contact with the upper surface of dielectric layer 219. Substrate 217 is for example made of a semiconductor material, for example, of silicon. Dielectric layer 219 is for example made of silicon oxide. As an example, dielectric layer 219 extends continuously and across a substantially uniform thickness all over the upper surface of substrate 217. Semiconductor layer 221 is for example made of single-crystal silicon. As an example, semiconductor layer 221 extends continuously and across a uniform thickness all over the upper surface of dielectric layer 219.

Dielectric layer 213 may be formed by oxidation of an upper portion of semiconductor layer 221, for example, according to a dry thermal oxidation method. As a variation, layer 213 may be formed by deposition of a dielectric material on the upper surface of semiconductor layer 221. Dielectric layer 213 is for example made of the same material as the dielectric layer 203 of the structure of FIG. 2B, for example, silicon oxide.

In this example, the thickness of dielectric layer 213 is smaller than that of dielectric layer 203, for example, at least twice smaller and preferably at least four times smaller than that of dielectric layer 203. The thickness of dielectric layer 213 is for example in the range from 10 nm to 5 μm, for example, in the order of 250 nm.

Cavity 215 may be formed by local etching from the upper surface of dielectric layer 213, for example, by plasma etching. In this example, cavity 215 is through, that is, it extends vertically across the entire thickness of dielectric layer 213 and emerges onto the upper surface of semiconductor layer 221.

In top view, the shape of cavity 215 is identical or similar to that of the cavity 205 of the structure of FIG. 2A, with the difference that, in the structure of FIG. 2D, dielectric layer 213 is removed from the entire surface of cavity 215, including the region of cavity 215 corresponding, in top view, to the dielectric region 207 of the structure of FIG. 2A. In other words, cavity 215 is not interrupted in the region corresponding, in top view, to the dielectric region 207 of the structure of FIG. 2A.

Figure 2E:
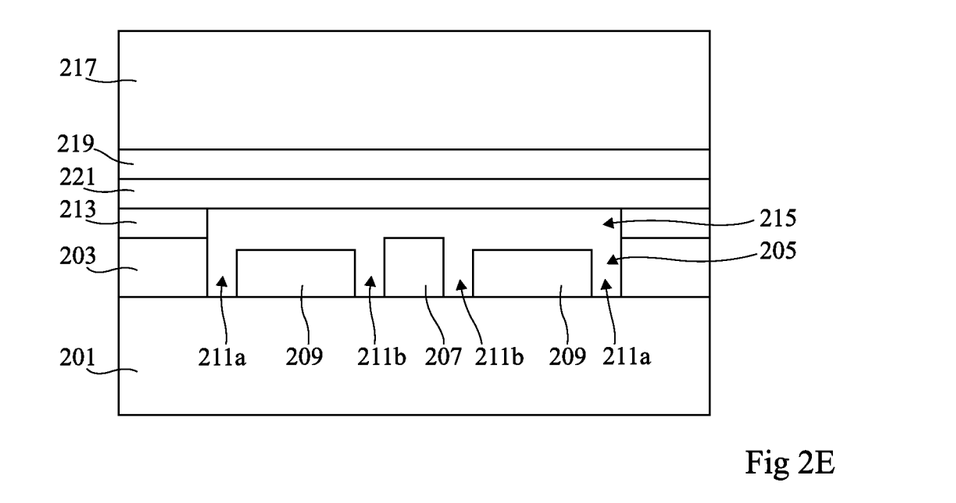

FIG. 2E is a cross-section view illustrating the structure obtained after a step of transferring the structure of FIG. 2D onto the structure of FIG. 2B.

During the transfer, the two structures are aligned with respect to each other so that the cavity 215 of the structure of FIG. 2D is placed opposite the cavity 205 of the structure of FIG. 2B. As an example, in vertical projection, the external contour of cavity 215 substantially coincides with the external contour of cavity 205.

In FIG. 2E, the structure of FIG. 2D has been turned over with respect to the orientation of FIG. 2D. The orientation of the structure of FIG. 2B is however unchanged.

The structure of FIG. 2D is affixed to the structure of FIG. 2B by direct bonding or molecular bonding of the surface of dielectric layer 213 opposite to semiconductor layer 221, that is, its lower surface in the orientation of FIG. 2E, to the surface of dielectric layer 203 opposite to substrate 201, that is, its upper surface in the orientation of FIG. 2E.

To improve the quality of the bonding, an anneal of the structure at a relatively high temperature may be provided, for example, at a temperature in the range from 700 to 1100° C. In this case, the material of conductive region 209 will advantageously be selected to be capable of withstanding such an anneal with no degradation. Polysilicon is in particular well adapted to such an anneal. Other conductive materials, for example, tungsten or molybdenum, may however be used according to the envisaged anneal temperature. As a variation, a low-temperature bonding may be implemented, for example, at a temperature lower than 450° C., in which case other metals may be used to form conductive region 209.

Figure 2F:
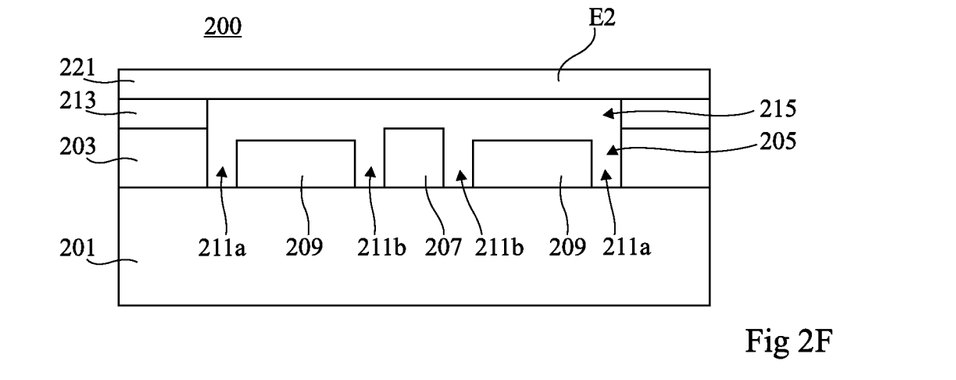

FIG. 2F is a cross-section view illustrating the structure of transducer 200 obtained after a step of removal of substrate 217 and of dielectric layer 219.

At the end of this step, only semiconductor layer 221 is kept above cavities 215 and 205, forming the flexible membrane of transducer 200. Membrane 221 is suspended, by its periphery, to the lateral walls delimiting cavity 205-215, formed by the non-etched peripheral portions of dielectric layers 213 and 203. The thickness of semiconductor membrane 221 is for example in the range from 10 nm to 10 μm.

The maximum vertical displacement amplitude of the membrane towards the bottom of the cavity is determined by the thickness of dielectric layer 213, which defines the depth of cavity 215.

Substrate 201 and conductive region 209 form the lower electrode E1 of transducer 200. Semiconductor membrane 221 forms the upper electrode E2 of transducer 200. Semiconductor membrane 221 may be doped, or undoped. For example, semiconductor membrane 221 has a doping level in the range from undoped to $10^{18}$ atoms/cm$^3$. To increase the electric conductivity, the upper electrode E2 of the transducer may further comprise a metal layer (not shown) arranged on top of and in contact with the upper surface of membrane 221, for example, as described in the example of FIG. 1.

Dielectric region 207 forms a mechanical stop preventing membrane 221 from coming into contact with lower electrode E1 in the collapsed position of the membrane.

An advantage of the transducer 200 of FIG. 2F is that, in the collapsed position of membrane 221, that is, when membrane 221 abuts against dielectric pad 207, no dielectric region forms an interface between upper electrode E2 and lower electrode E1 at the location where the electric field is the strongest, that is, opposite the upper surface of conductive region 209. This enables to significantly decrease, or even to suppress, the charge injection phenomena observed in a structure of the type described in relation with FIG. 1. At the level of dielectric pad 207, the electric field is relatively low due to the relatively large thickness of dielectric layer 203. Further, the relatively large thickness (sum of the thicknesses of dielectric layers 203 and 213) of the peripheral dielectric walls separating substrate 201 from membrane 221 enables to decrease parasitic capacitive couplings between electrodes E1 and E2 at the periphery of the structure.

FIGS. 3A to 3E are cross-section views illustrating steps of another example of a method of manufacturing a CMUT transducer 300 according to an embodiment.

Figure 3A:
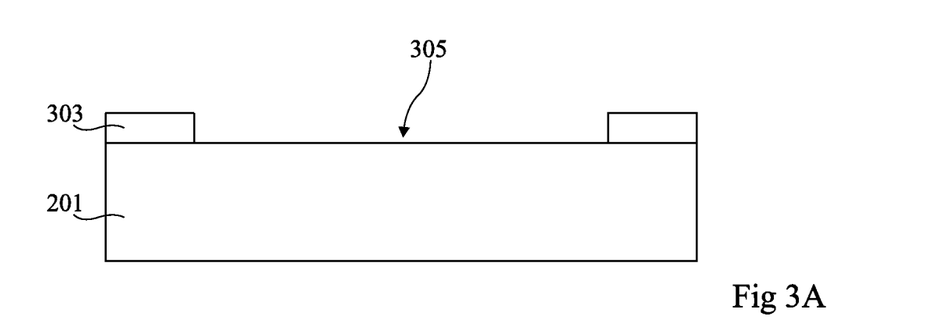
FIGS. 3A, 3B, 3C, 3D, and 3E are cross-section views illustrating steps of another example of a method of manufacturing a CMUT transducer according to an embodiment.

FIG. 3A shows the structure obtained at the end of a step of forming a dielectric layer 303 on the upper surface side of a substrate 301, followed by a step of forming a cavity 305 on the upper surface side of dielectric layer 303.

Substrate 301 is for example identical or similar to the substrate 201 of FIG. 2A.

Similarly to what has been previously described, layer 303 may be formed by oxidation of an upper portion of substrate 301, or by deposition of a dielectric material on the upper surface of substrate 301. Dielectric layer 303 is for example made of silicon oxide. The thickness of layer 303 is for example in the range from 10 nm to 5 µm, for example, in the order of 250 nm.

Cavity 305 may be formed by local etching from the upper surface of dielectric layer 303, for example, by plasma etching. In this example, cavity 305 is through, that is, it extends vertically across the entire thickness of dielectric layer 303 and emerges onto the upper surface of substrate 301. The pattern, in top view, of cavity 305, is for example identical or similar to that of the cavity 215 of the structure of FIG. 2D.

Figure 3B:
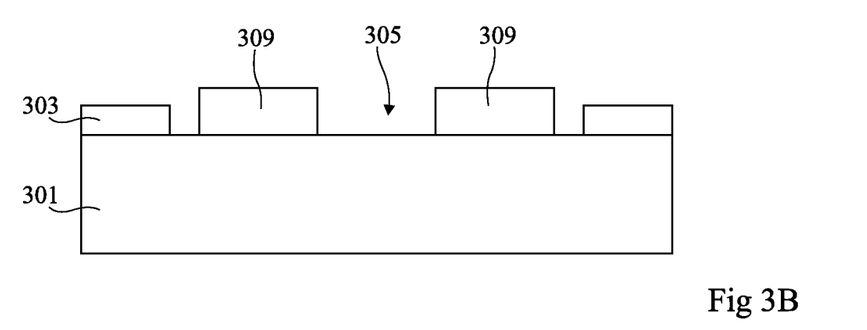

FIG. 3B shows the structure obtained at the end of a subsequent step of forming, in cavity 305, a conductive region 309 in contact with the upper surface of substrate 301.

Conductive region 309 is identical or similar to the conductive region 209 of the structure of FIGS. 2B and 2C. In particular, in the shown example, conductive region 309 is interrupted in a central region of cavity 305. Further, in this example, laterally, conductive region 309 does not extend all the way to the sides of dielectric layer 303.

Like the conductive region 209 of FIGS. 2B and 2C, conductive region 309 may be formed by deposition of a conductive layer all over the upper surface of the structure, followed by a step of local removal of the conductive layer to only keep conductive region 309.

In this example, the thickness of conductive region 309 is greater than the thickness of dielectric layer 303.

Figure 3C:
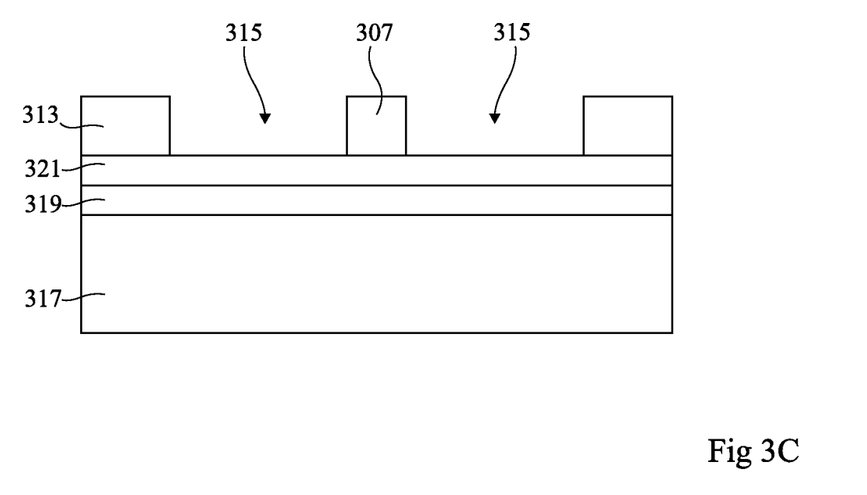

FIG. 3C shows the structure obtained at the end of a step of forming a dielectric layer 313 on the upper surface side of a stack of semiconductor-on-insulator (SOI) type, followed by a step of forming a cavity 315 on the upper surface side of dielectric layer 313.

In this example, the initial stack comprises a support substrate 317, a dielectric layer 319 arranged on top of and in contact with the upper surface of substrate 317, and a semiconductor layer 321 arranged on top of and in contact with the upper surface of dielectric layer 319. This stack is identical or similar to the stack 217-219-221 of FIG. 2D.

As previously, dielectric layer 313 may be formed by oxidation of an upper portion of semiconductor layer 321, or by deposition of a dielectric material on the upper surface of semiconductor layer 321. Dielectric layer 313 is for example made of the same material as the dielectric layer 303 of the structure of FIG. 2B, for example, silicon oxide. In this example, the thickness of dielectric layer 313 is further greater than that of dielectric layer 303, for example, at least twice greater than that of dielectric layer 303. In this example, the thickness of dielectric layer 313 is greater than the thickness of conductive region 309. As an example, the thickness of dielectric layer 313 is greater by from 10 nm to 200 nm, for example, by approximately 100 nm, than the thickness of conductive region 309. The thickness of dielectric layer 313 is for example in the range from 20 nm to 5 µm, for example, in the order of 500 nm.

Cavity 315 may be formed by local etching from the upper surface of dielectric layer 313, for example, by plasma etching. In this example, cavity 315 is through, that is, it extends vertically across the entire thickness of dielectric layer 313 and emerges onto the upper surface of semiconductor layer 321.

The pattern, in top view, of cavity 315 is for example identical or similar to that of the cavity 205 of the structure of FIG. 2A. In particular, dielectric layer 313 is kept intact in a central region 307 of cavity 315, located opposite the area of interruption of the conductive region 309 of the structure of FIG. 3B. The dielectric region 307 of interruption of cavity 315 corresponds, in top view, to the region 207 of the structure of FIG. 2A.

Figure 3D:
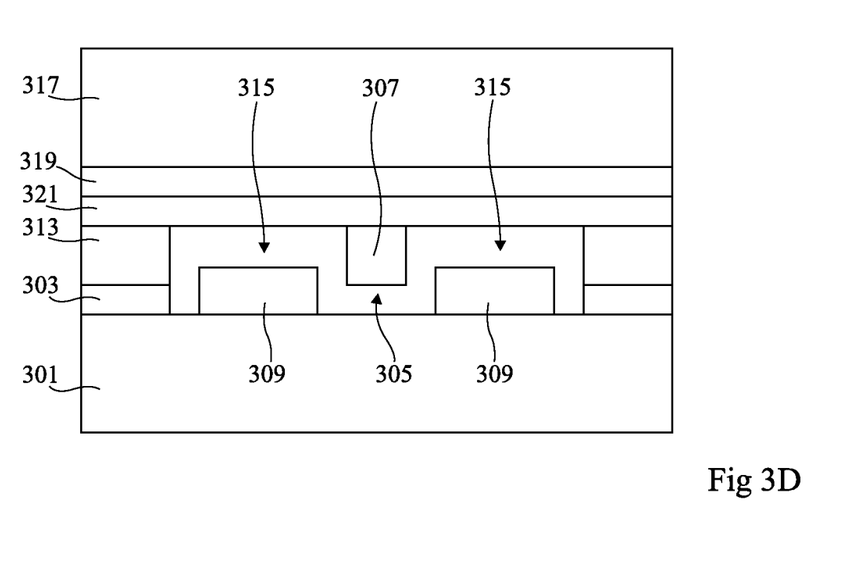

FIG. 3D shows the structure obtained after a step of transfer of the structure of FIG. 3C onto the structure of FIG. 3B.

In FIG. 3D, the structure of FIG. 3C has been turned over with respect to the orientation of FIG. 3C. The orientation of the structure of FIG. 3B is however unchanged.

Similarly to what has been described in relation with FIG. 2E, during the transfer, the two structures are aligned with respect to each other so that the cavity 315 of the structure of FIG. 3C is placed opposite the cavity 305 of the structure of FIG. 3B.

As in the previous example, the structure of FIG. 3C may be bonded to the structure of FIG. 3B by direct bonding of the surface of dielectric layer 313 opposite to semiconductor layer 321, that is, its lower surface in the orientation of FIG. 3D, onto the surface of dielectric layer 303 opposite to substrate 301, that is, its upper surface in the orientation of FIG. 3D.

Figure 3E:
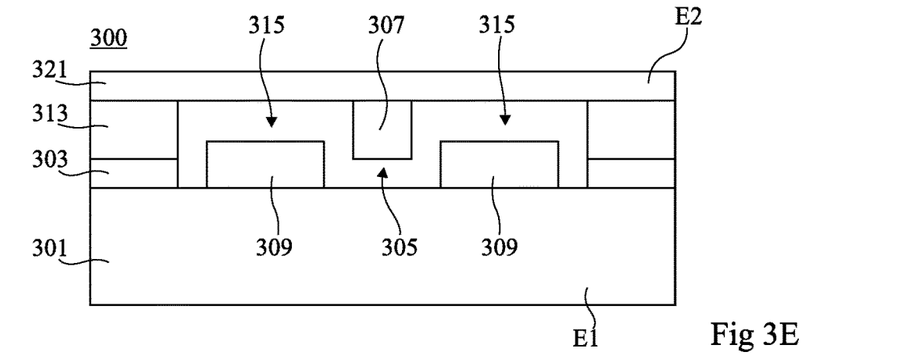

FIG. 3E shows the structure of transducer 300 obtained after a step of removal of substrate 317 and of dielectric layer 319.

At the end of this step, only semiconductor layer 321 is kept above cavities 315 and 305, forming the flexible membrane of transducer 300.

The maximum vertical displacement amplitude of the membrane towards the bottom of the cavity is determined by the thickness of dielectric layer 303, which defines the depth of cavity 305.

Substrate 301 and conductive region 309 form the lower electrode E1 of transducer 300. Semiconductor membrane 321 forms the upper electrode E2 of transducer 300. As previously described, the upper electrode E2 of the transducer may further comprise a metal layer (not shown) arranged on top of and in contact with the upper surface of membrane 321.

Dielectric region 307, affixed to the lower surface of membrane 321, forms a mechanical stop preventing membrane 321 from coming into contact with the lower electrode E1 of the transducer in the collapsed position of the membrane.

As for the transducer 200 of FIG. 2F, an advantage of transducer 300 is that, in the collapsed position of membrane 321, that is, when dielectric pad 307 abuts against the upper surface of substrate 301 at the bottom of cavity 305, no dielectric region forms an interface between upper electrode E2 and lower electrode E1 at the location where the electric field is the strongest, that is, opposite the upper surface of conductive region 309. This enables to significantly decrease, or even to suppress, charge injection phenomena. At the level of dielectric pad 307, the electric field is relatively low due to the relatively large thickness of dielectric layer 313. Further, the relatively large thickness (sum of the thicknesses of dielectric layers 303 and 313) of the peripheral dielectric walls separating substrate 301 from membrane 321 enables to decrease parasitic capacitive couplings between electrodes E1 and E2 at the periphery of the structure.

FIGS. 4A to 4F are cross-section views illustrating steps of another example of a method of manufacturing a CMUT transducer 400 according to an embodiment.

Figure 4A:
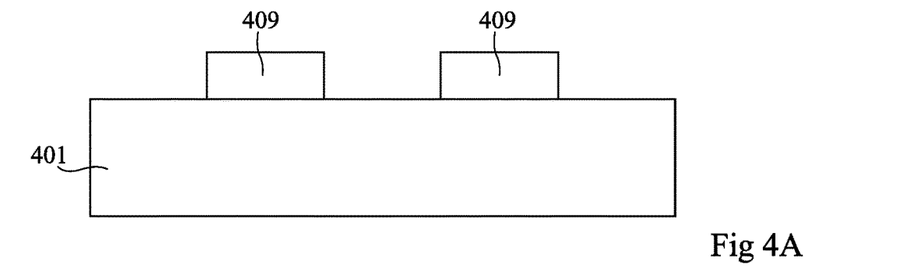
FIGS. 4A, 4B, 4C, 4D, 4E, and 4F are cross-section views illustrating steps of another example of a method of manufacturing a CMUT transducer according to an embodiment.

FIG. 4A shows the structure obtained at the end of a step of forming a conductive region 409 on top of and in contact with the upper surface of a substrate 401. Substrate 401 and conductive region 409 are substantially identical respectively to substrate 301 and to the conductive region 309 of the structure of FIG. 3A, or to substrate 201 and to the conductive region 209 of the structure of FIG. 2B. In this example, no dielectric layer is formed on the upper surface side of substrate 401 prior to the forming of conductive region 409.

Figure 4B:
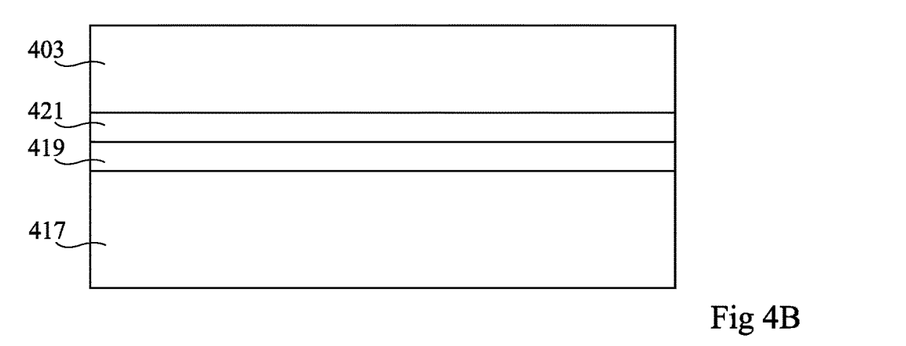

FIG. 4B shows the structure obtained at the end of a step of forming a dielectric layer 403 on the upper surface side of a stack of semiconductor-on-insulator (SOI) type.

In this example, the initial stack comprises a support substrate 417, a dielectric layer 419 arranged on top of and in contact with the upper surface of substrate 417, and a semiconductor layer 421 arranged on top of and in contact with the upper surface of dielectric layer 419. The stack is identical or similar to the stack 217-219-221 of FIG. 2D or to the stack 317-319-312 of FIG. 3C.

As in the previous examples, dielectric layer 403 may be formed by oxidation of an upper portion of semiconductor layer 421, or by deposition of an electric material on the upper surface of semiconductor layer 421. In this example, the thickness of dielectric layer 403 corresponds to the sum of the thicknesses of the dielectric layers 203 and 213 of the transducer 200 of FIG. 2F or 303 and 313 of the transducer 300 of FIG. 3E. The thickness of dielectric layer 403 is in particular greater than the thickness of conductive region 409. As an example, the thickness of dielectric layer 403 is in the range from 30 nm to 10 µm, for example, in the order of 750 nm. Dielectric layer 403 is for example made of silicon oxide.

Figure 4C:
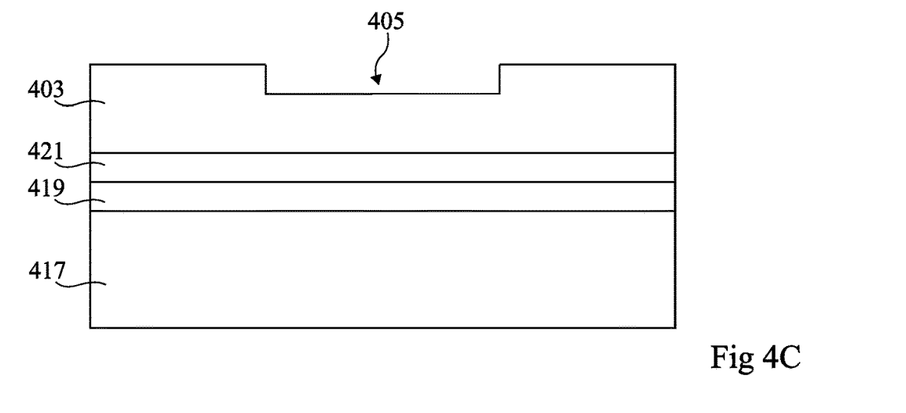

FIG. 4C shows the structure obtained at the end of a step of forming a cavity 405 in dielectric layer 403, on the upper surface side of layer 403. Cavity 405 is non-through, that is, it does not emerge onto the upper surface of semiconductor layer 421. Cavity 405 is located on a portion only of the transducer surface. In particular, cavity 405 does not extend opposite the future peripheral walls of suspension of the transducer membrane.

In this example, the depth of cavity 405 is smaller than or equal to half the initial thickness of dielectric layer 403, for example, smaller than or equal to one third of the initial thickness of layer 403, for example, smaller than or equal to one fifth of the initial thickness of layer 403. The depth of cavity 405 is for example in the range from 10 nm to 5 µm, for example, in the order of 250 nm.

Cavity 405 may be formed by local etching from the upper surface of dielectric layer 403, for example, by plasma etching.

Figure 4D:
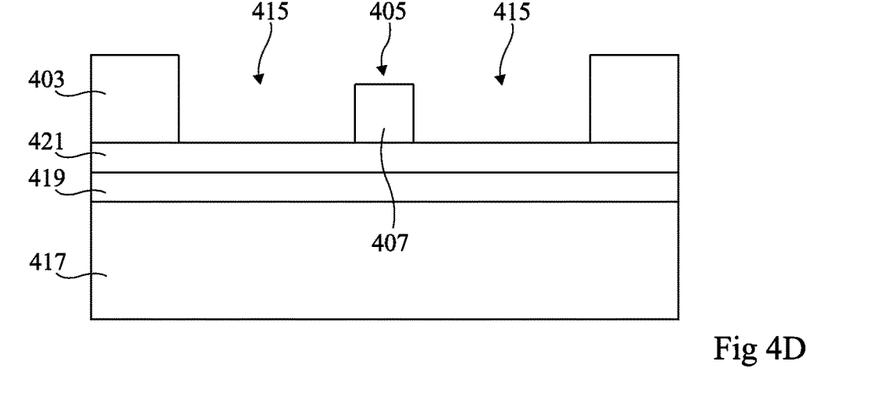

FIG. 4D shows the structure obtained at the end of a second step of forming a cavity 415 in dielectric layer 403, on the upper surface side of layer 403.

Cavity 415 may be formed by local etching from the upper surface of dielectric layer 403, for example, by plasma etching. In this example, cavity 415 is through, that is, it extends vertically across the entire thickness of dielectric layer 403 and emerges onto the upper surface of semiconductor layer 421.

The pattern, in top view, of cavity 415, is for example identical or similar to that of the cavity 205 of FIG. 2A or 315 of FIG. 3C. In particular, dielectric layer 403 is not removed from a central region 407 of cavity 415. The dielectric region 407 kept intact on forming of cavity 415 is located opposite the cavity 405 formed at the previous step. In other words, the region 407 which is not etched at the step of FIG. 4D corresponds to a region etched at the step of FIG. 4C. Thus, the region 407 of interruption of cavity 415 has a height smaller than that of the dielectric walls laterally delimiting cavity 415.

Figure 4E:
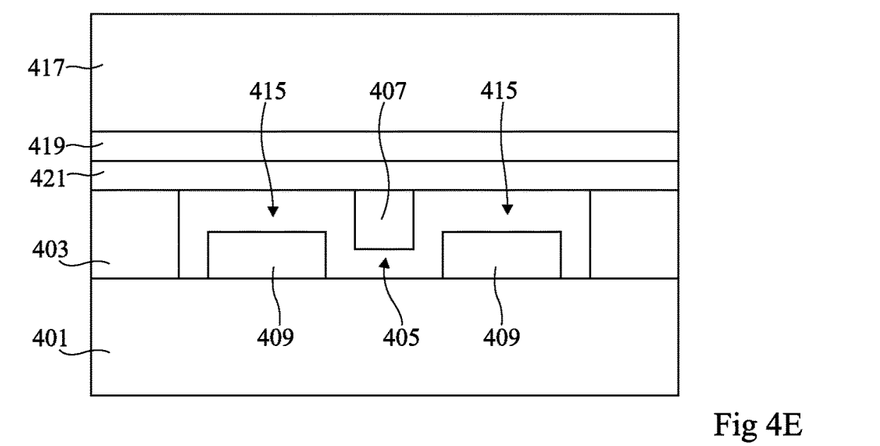

FIG. 4E shows the structure obtained after a step of transferring the structure of FIG. 4D onto the structure of FIG. 4A.

During the transfer, the two structure are aligned with respect to each other so that the dielectric region 407 of the structure of FIG. 4D is placed opposite the area of interruption of the conductive region 409 of the structure of FIG. 4A.

In FIG. 4E, the structure of FIG. 4D has been turned over with respect to the orientation of FIG. 4D. The orientation of the structure of FIG. 4A is however unchanged.

Similarly to what has been previously described, the structure of FIG. 4D is bonded to the structure of FIG. 4A by direct bonding or molecular bonding of the surface of dielectric layer 403 opposite to semiconductor layer 421, that is, its lower surface in the orientation of FIG. 4E, on the upper surface of substrate 401.

Figure 4F:
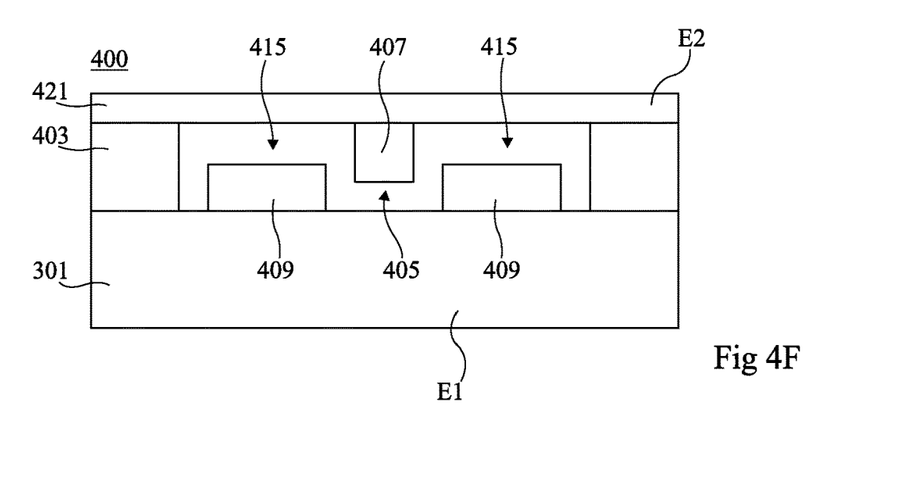

FIG. 4F shows the structure of transducer 400 obtained after a step of removal of substrate 417 and of dielectric layer 419.

At the end of this step, only semiconductor layer 421 is kept above cavities 415 and 405, forming the flexible membrane of transducer 400.

The maximum vertical displacement amplitude of the membrane towards the bottom of the cavity is determined by the depth of the cavity 405 of FIG. 4C.

Substrate 401 and conductive region 409 form, in this example, the lower electrode E1 of transducer 400. Semiconductor membrane 421 forms the upper electrode E2 of transducer 400. As previously, the upper electrode E2 of the transducer may further comprise a metal layer (not shown) arranged on top of and in contact with the upper surface of membrane 421.

As in the transducer 300 of FIG. 3E, dielectric region 407, affixed to the lower surface of membrane 421, forms a mechanical stop preventing membrane 421 from coming into contact with the lower electrode E1 of the transducer in the collapsed position of the membrane. More generally, the transducer 400 of FIG. 4E substantially has the same advantages as the transducer 300 of FIG. 3E or the transducer 200 of FIG. 2F.

FIGS. 5A to 5E are cross-section views illustrating steps of another example of a method of manufacturing an ultrasound transducer 500 according to an embodiment.

Figure 5A:
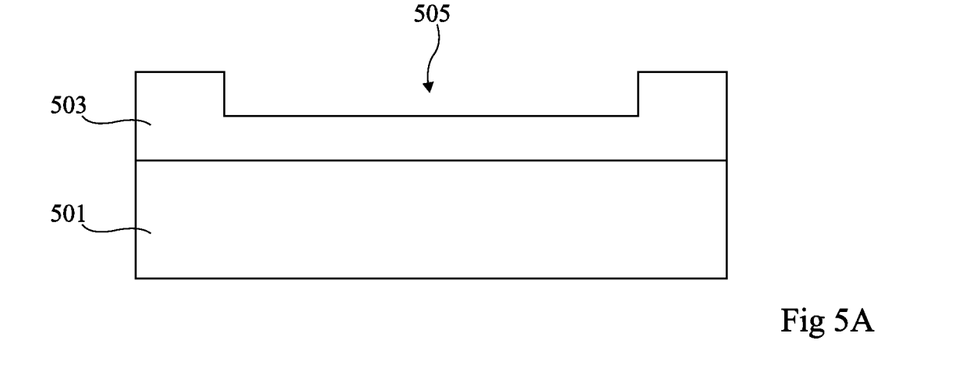
FIGS. 5A, 5B, 5C, 5D, and 5E are cross-section views illustrating steps of another example of a method of manufacturing a CMUT transducer according to an embodiment.

FIG. 5A shows the structure obtained at the end of a step of forming a dielectric layer 503 on the upper surface side of a substrate 501, followed by a step of forming a cavity 505 on the upper surface side of dielectric layer 503.

Substrate 501 is for example identical to the substrates 201, 301, and 401 of the previous examples.

As in the previous examples, layer 503 may be formed by oxidation of an upper portion of substrate 501, or by deposition of a dielectric material on the upper surface of substrate 501. Layer 503 is for example made of silicon oxide. The thickness of layer 503 is for example in the range from 1 to 6 µm, for example, in the order of 4 µm.

Cavity 505 may be formed by local etching from the upper surface of dielectric layer 203, for example, by plasma etching. In this example, cavity 205 is non-through, that is, it does not emerge on the upper surface side of substrate 501. In top view, the pattern of cavity 505 is for example identical or similar to that of the cavity 215 of the structure of FIG. 3D. The depth of cavity 505 is for example smaller than or equal to half the initial thickness of dielectric layer 503. As an example, the depth of cavity 505 is smaller than or equal to 1 µm.

Figure 5B:
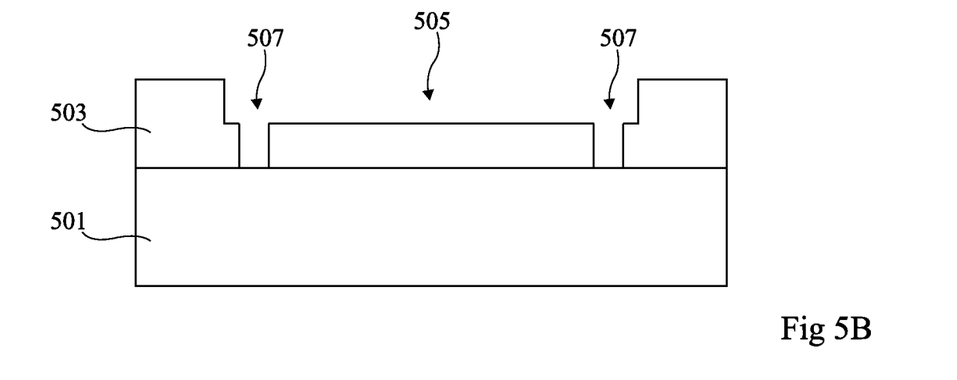

FIG. 5B shows the structure obtained at the end of a step of forming, at the bottom of cavity 505, one or a plurality of local openings 507 vertically crossing dielectric layer 503 and emerging onto the upper surface of substrate 501. Openings 507 are for example formed by photolithography and etching.

Figure 5C:
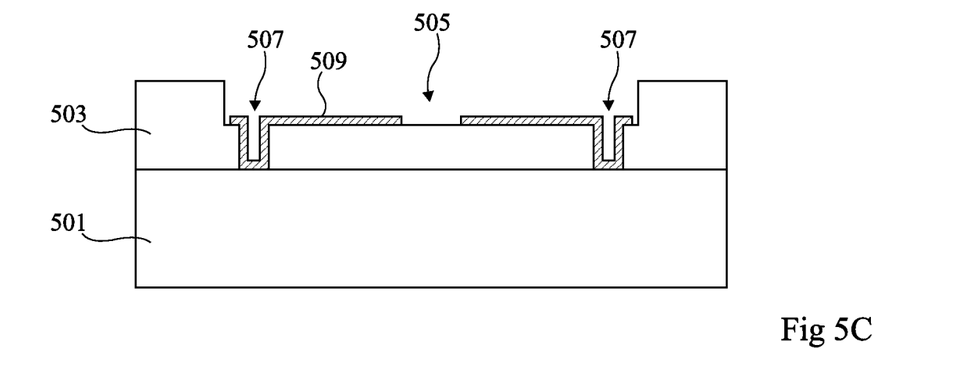

FIG. 5C shows the structure obtained at the end of a subsequent step of forming of a conductive region or layer 509 extending on the lateral walls and at the bottom of openings 507, as well as on the upper surface of dielectric layer 503 at the bottom of cavity 505. Conductive region 509 is located inside of cavity 505. In particular, region 505 does not extend on the lateral walls of cavity 505 or on the upper surface of dielectric layer 503 outside of cavity 505. Conductive region 509 is further interrupted in a central area of cavity 505. In top view, the pattern of conductive region 509 is for example identical or similar to that of the conductive region 209 of the structure of FIG. 2B.

Conductive region 509 is intended to play the role of the conductive regions 209, 309, or 409 of the previous examples. Its thickness may however be much smaller since it rests on a dielectric support (the lower portion of dielectric layer 503 at the bottom of cavity 505) which takes it closer to the upper surface of the cavity. The contact with the upper surface of substrate 501 is achieved through openings 507. As an example, the thickness of conductive layer 509 is in the range from 50 to 400 nm. The material of layer 509 may be identical or similar to that of the regions 209, 309, and 409 of the previous examples.

Figure 5D:
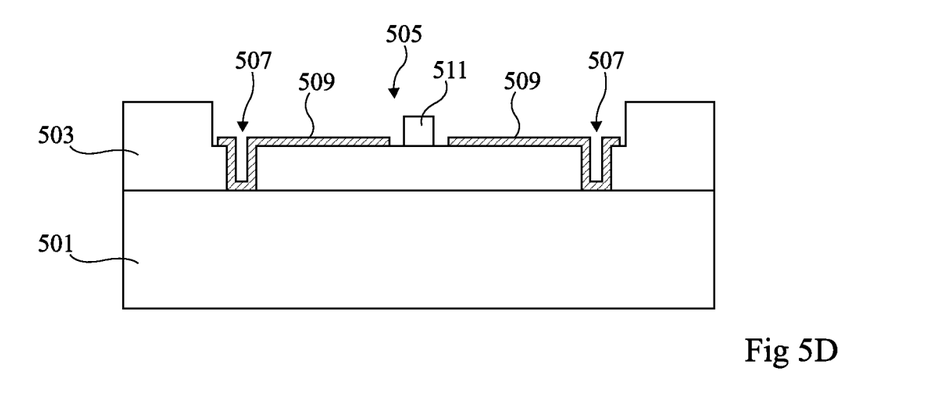

FIG. 5D shows the structure obtained at the end of a step of forming a dielectric region 511 in cavity 505, opposite the region of interruption of conductive region 509. Dielectric region 511 is in contact, by its lower surface, with the upper surface of dielectric layer 503 at the bottom of cavity 505. In the shown example, a non-zero distance laterally separates dielectric region 511 from conductive region 509. The thickness or the height (vertical dimension in the orientation of FIG. 5D) of dielectric region 511 is greater than the thickness of conductive region 509. The thickness of dielectric region 511 is however smaller than the depth of cavity 505. In other words, the upper surface of dielectric region 511 is recessed with respect to the upper surface of cavity 505. In top view, dielectric region 511 for example has a shape identical or similar to that of the dielectric region 207 of FIG. 2A.

The forming of dielectric region 511 may for example comprise a step of deposition of a dielectric layer having a uniform thickness all over the upper surface of the structure of FIG. 5C, followed by a step of local removal of the dielectric layer, for example, by photolithography and etching, to only keep region 511. Preferably, dielectric region 511 is made of a material selectively etchable over the material of dielectric layer 503 and over the material of conductive region 509. Dielectric region 511 is for example made of silicon nitride (SiN).

Figure 5E:
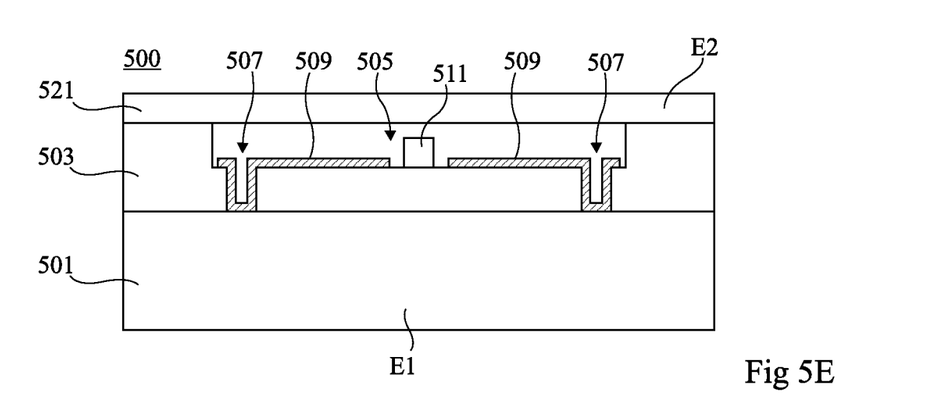

FIG. 5E shows the structure of transducer 500 obtained after a step of forming a semiconductor membrane 521 suspended above cavity 505.

Similarly to what has been previously described, membrane 521 may correspond to a semiconductor layer of a SOT stack, transferred onto the upper surface of the structure of FIG. 5D and affixed by direct bonding to the upper surface of dielectric layer 503.

The maximum vertical displacement amplitude of membrane 521 towards the bottom of the cavity is set by the difference between the depth of the cavity 505 formed at the step of FIG. 5A, and the height of the dielectric region 511 formed at the step of FIG. 5D. This amplitude is for example in the range from 10 nm to 5 µm, for example, in the order of 250 nm.

Substrate 501 and conductive region 509 form, in this example, the lower electrode E1 of transducer 500. Semiconductor membrane 521 forms the upper electrode E2 of transducer 500. In the same way as in the previous examples, the upper electrode E2 of the transducer may further comprise a metal layer (not shown) arranged on top of and in contact with the upper surface of membrane 521.

In transducer 500, the dielectric region 511 located at the bottom of cavity 505 forms a mechanical stop preventing membrane 521 from coming into contact with the lower electrode E1 of the transducer in the collapsed position of the membrane. Transducer 500 thus substantially has the same advantages as the previously-described transducers 200, 300, and 400.

Figure 6:
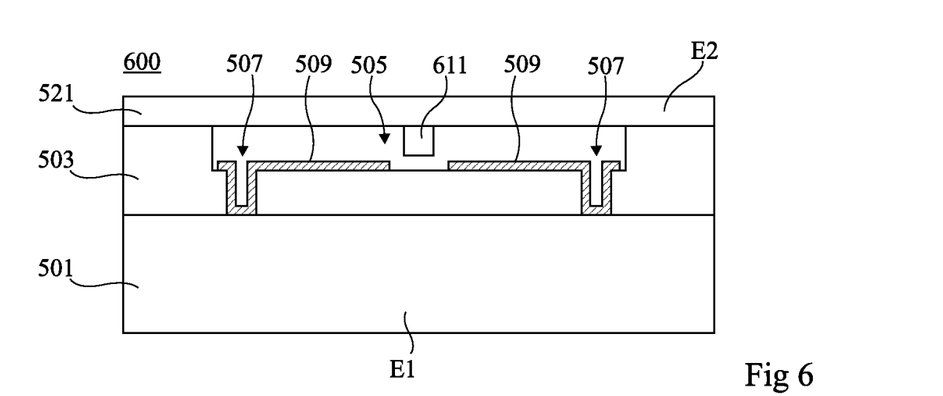
FIG. 6 is a cross-section view illustrating a variant of the method of FIGS. 5A to 5E.

FIG. 6 is a cross-section view illustrating an alternative embodiment of the method of FIGS. 5A to 5E. FIG. 6 more particularly shows the structure of a CMUT transducer 600 formed according to this variation.

The variation of FIG. 6 differs from the example of FIGS. 5A to 5E mainly in that, in the variation of FIG. 6, dielectric region 511 is replaced with an identical or similar region, formed no longer at the bottom of cavity 505, but on the lower surface of membrane 521, before the transfer of membrane 521 onto the upper surface of the structure of FIG. 5C.

Various embodiments and variants have been described. Those skilled in the art will understand that certain features of these various embodiments and variants may be combined, and other variants will occur to those skilled in the art. In particular, the described embodiments are not limited to the examples of dimensions or to the examples of materials mentioned in the present disclosure.

Further, although a single CMUT transducer is shown in the drawings, in practice, a plurality of identical or similar transducers may be simultaneously monolithically formed on a same substrate.

Further, in the described examples, the dielectric mechanical stop 207, respectively 307, respectively 407, respectively 511 preventing the membrane from coming into contact with lower electrode E2 has the shape of a pillar arranged, in top view, in a central region of the transducer cavity. The described embodiments are however not limited to this specific case. More generally, dielectric region 207, respectively 307, respectively 407, respectively 511 may have any other shape and/or any other layout. As an example, dielectric region 207, respectively 307, respectively 407, respectively 511 may comprise a plurality of separate pillars distributed in top view, on the surface occupied by the cavity (not necessarily at the center of the cavity). As a variation, dielectric region 207, respectively 307, respectively 407, respectively 511, may have, in top view, the shape of one or a plurality of lines, for example, of a cross, crossing all or part of the transducer cavity.

What is claimed is:

1. A method of manufacturing a CMUT transducer comprising:
    a conductive or semiconductor substrate coated with a stack of one or a plurality of dielectric layers;
    a cavity formed in said stack;
    a conductive or semiconductor membrane suspended above the cavity;
    at the bottom of the cavity, a conductive region in contact with the upper surface of the substrate, said conductive region being interrupted on a portion of the upper surface of the substrate; and
    in the cavity, a stop structure made of a dielectric material localized on or above the area of interruption of the conductive region,
    the method comprising the steps of:
    a) forming a first dielectric layer on the upper surface of the substrate;
    b) etching the first dielectric layer down the upper surface of the substrate to form a lower portion of the cavity of the transducer, while keeping in a central portion of the cavity a portion of the first dielectric layer forming the stop structure of the transducer;
    c) depositing at the bottom of the cavity a conductive layer having a thickness smaller than that of the first dielectric layer, forming the conductive region of the transducer;
    d) forming a second dielectric layer on a surface of a semiconductor layer arranged on a temporary support;
    e) etching the second dielectric layer down to the surface of the semiconductor layer to form an upper portion of the cavity;
    f) assembling the temporary support and the substrate by bonding of the surface of the first dielectric layer opposite to the substrate onto the surface of the second dielectric layer opposite to the semiconductor layer; and
    g) removing the temporary support, while keeping above the cavity the semiconductor layer forming the membrane of the transducer.

2. A method of manufacturing a CMUT transducer comprising:
    a conductive or semiconductor substrate coated with a stack of one or a plurality of dielectric layers;
    a cavity formed in said stack;
    a conductive or semiconductor membrane suspended above the cavity;
    at the bottom of the cavity, a conductive region in contact with the upper surface of the substrate, said conductive region being interrupted on a portion of the upper surface of the substrate; and
    in the cavity, a stop structure made of a dielectric material localized on or above the area of interruption of the conductive region,
    the method comprising the steps of:
    a) forming a first dielectric layer on the upper surface of the substrate;
    b) etching the first dielectric layer down to the upper surface of the substrate to form a lower portion of the cavity;
    c) depositing at the bottom of the cavity a conductive layer having a thickness greater than that of the first dielectric layer, forming the conductive region of the transducer;
    d) forming a second dielectric layer on a surface of a semiconductor layer arranged on a temporary support;
    e) etching the second dielectric layer down to the surface of the semiconductor layer to form an upper portion of the cavity, while keeping in a central portion of the cavity a portion of the second dielectric layer forming the stop structure of the transducer;
    f) assembling the temporary support and the substrate by bonding of the surface of the first dielectric layer opposite to the substrate onto the surface of the second dielectric layer opposite to the semiconductor layer; and
    g) removing the temporary support, while keeping above the cavity the semiconductor layer forming the membrane of the transducer.

3. A method of manufacturing a CMUT transducer comprising:
    a conductive or semiconductor substrate coated with a stack of one or a plurality of dielectric layers;
    a cavity formed in said stack;
    a conductive or semiconductor membrane suspended above the cavity;
    at the bottom of the cavity, a conductive region in contact with the upper surface of the substrate, said conductive region being interrupted on a portion of the upper surface of the substrate; and
    in the cavity, a stop structure made of a dielectric material localized on or above the area of interruption of the conductive region,
    the method comprising the steps of:
    a) forming the conductive region on top of and in contact with the upper surface of the substrate;
    b) forming a dielectric layer on a surface of a semiconductor layer arranged on a temporary support;
    c) etching a portion of the thickness of the dielectric layer to form a first cavity;

d) etching the first dielectric layer down to the upper surface of the substrate to form a second cavity, while keeping in a central portion of the second cavity a portion of the first dielectric layer partially etched at step c);
e) assembling the temporary support and the substrate by bonding of the surface of dielectric layer opposite to the semiconductor layer onto the upper surface of the substrate; and
f) removing the temporary support, while keeping above the cavity the semiconductor layer forming the membrane of the transducer.

4. A method of manufacturing a CMUT transducer comprising:
a conductive or semiconductor substrate coated with a stack of one or a plurality of dielectric layers;
a cavity formed in said stack;
a conductive or semiconductor membrane suspended above the cavity;
at the bottom of the cavity, a conductive region in contact with the upper surface of the substrate, said conductive region being interrupted on a portion of the upper surface of the substrate; and
in the cavity, a stop structure made of a dielectric material localized on or above the area of interruption of the conductive region,
the method comprising the steps of:
a) forming a dielectric layer on the upper surface of the substrate;
b) etching a portion of the thickness of the dielectric layer to form the cavity of the transducer;
c) forming, at the bottom of the cavity, openings crossing the dielectric layer and emerging onto the upper surface of the substrate;
d) depositing the conductive region in the cavity on top of and in contact with the upper surface of the dielectric layer and in the openings;
e) forming the stop structure in the cavity, on top of and in contact with the upper surface of the dielectric layer, so that said structure has a thickness greater than that of the conductive region and smaller than the depth of the cavity;
f) providing a semiconductor layer arranged on a temporary support;
g) assembling the temporary support and the substrate by bonding of the surface of the semiconductor layer opposite to the temporary support onto the surface of the dielectric layer opposite to the substrate; and
h) removing the temporary support, while keeping above the cavity the semiconductor layer forming the membrane of the transducer.

5. A method of manufacturing a CMUT transducer comprising:
a conductive or semiconductor substrate coated with a stack of one or a plurality of dielectric layers;
a cavity formed in said stack;
a conductive or semiconductor membrane suspended above the cavity;
at the bottom of the cavity, a conductive region in contact with the upper surface of the substrate, said conductive region being interrupted on a portion of the upper surface of the substrate; and
in the cavity, a stop structure made of a dielectric material localized on or above the area of interruption of the conductive region,
the method comprising the steps of:
a) forming a dielectric layer on the upper surface of the substrate;
b) locally etching a portion of the thickness of the dielectric layer to form the cavity of the transducer;
c) forming, at the bottom of the cavity, openings crossing the dielectric layer and emerging onto the upper surface of the substrate;
d) depositing the conductive region in the cavity on top of and in contact with the upper surface of the dielectric layer and in the openings;
e) providing a semiconductor layer arranged on a temporary support;
f) forming the stop structure on the surface of the semiconductor layer opposite to the temporary support, so that said structure has a thickness greater than that of the conductive region and smaller than the depth of the cavity;
g) assembling the temporary support and the substrate by bonding of the surface of the semiconductor layer opposite to the temporary support onto the surface of the dielectric layer opposite to the substrate; and
h) removing the temporary support, while keeping above the cavity the semiconductor layer forming the membrane of the transducer.

6. The method of claim 1, wherein the stop structure has a height greater than that of the conductive region, to prevent any contact between the membrane and the conductive region in case of a collapsing of the membrane.

7. The method of claim 1, wherein the stop structure has a height smaller than that of the cavity to allow a vertical displacement of the membrane towards the bottom of the cavity.

8. The method of claim 1, wherein the conductive region is made of doped polysilicon.

9. The method of claim 2, wherein the stop structure has a height greater than that of the conductive region, to prevent any contact between the membrane and the conductive region in case of a collapsing of the membrane.

10. The method of claim 2, wherein the stop structure has a height smaller than that of the cavity to allow a vertical displacement of the membrane towards the bottom of the cavity.

11. The method of claim 2, wherein the conductive region is made of doped polysilicon.

12. The method of claim 3, wherein the stop structure has a height greater than that of the conductive region, to prevent any contact between the membrane and the conductive region in case of a collapsing of the membrane.

13. The method of claim 3, wherein the stop structure has a height smaller than that of the cavity to allow a vertical displacement of the membrane towards the bottom of the cavity.

14. The method of claim 3, wherein the conductive region is made of doped polysilicon.

15. The method of claim 4, wherein the stop structure has a height greater than that of the conductive region, to prevent any contact between the membrane and the conductive region in case of a collapsing of the membrane.

16. The method of claim 4, wherein the stop structure has a height smaller than that of the cavity to allow a vertical displacement of the membrane towards the bottom of the cavity.

17. The method of claim 4, wherein the conductive region is made of doped polysilicon.

18. The method of claim 5, wherein the stop structure has a height greater than that of the conductive region, to prevent any contact between the membrane and the conductive region in case of a collapsing of the membrane.

19. The method of claim 5, wherein the stop structure has a height smaller than that of the cavity to allow a vertical displacement of the membrane towards the bottom of the cavity.

20. The method of claim 5, wherein the conductive region is made of doped polysilicon.

* * * * *